(12) United States Patent
Niwa

(10) Patent No.: US 10,892,240 B2
(45) Date of Patent: Jan. 12, 2021

(54) SEMICONDUCTOR FABRICATION APPARATUS AND SEMICONDUCTOR FABRICATION METHOD

(71) Applicant: TOSHIBA MEMORY CORPORATION, Minato-ku (JP)

(72) Inventor: Keiichi Niwa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 143 days.

(21) Appl. No.: 16/126,009

(22) Filed: Sep. 10, 2018

(65) Prior Publication Data
US 2019/0295976 A1 Sep. 26, 2019

(30) Foreign Application Priority Data

Mar. 20, 2018 (JP) ................. 2018-053261

(51) Int. Cl.
| | | |
|---|---|---|
| B23K 1/00 | (2006.01) | |
| H01L 23/00 | (2006.01) | |
| B23K 1/20 | (2006.01) | |
| B23K 101/40 | (2006.01) | |
| B23K 3/08 | (2006.01) | |

(52) U.S. Cl.
CPC ............ *H01L 24/11* (2013.01); *B23K 1/203* (2013.01); *H01L 24/05* (2013.01); *H01L 24/742* (2013.01); *B23K 3/082* (2013.01); *B23K 2101/40* (2018.08); *H01L 2224/022* (2013.01); *H01L 2224/05647* (2013.01); *H01L 2224/117* (2013.01); *H01L 2224/119* (2013.01); *H01L 2224/742* (2013.01)

(58) Field of Classification Search
CPC ....... H01L 24/11; H01L 24/05; H01L 24/742; H01L 2224/742; H01L 2224/022; H01L 2224/05647; H01L 2224/117; H01L 2224/119; H01L 2924/381; H01L 2224/11013; H01L 24/13; H01L 2224/11849; H01L 2224/111; H01L 2224/0382; H01L 2224/0401; H01L 2224/81375; H01L 2224/13101; H01L 21/67011; H01L 21/67144; H01L 24/03; B23K 1/203; B23K 2101/40; B23K 2101/36–42; B23K 3/0669; B23K 3/082; B23K 1/0016

USPC ... 228/179.1–180.22, 207, 214, 224, 13, 31, 228/33, 41, 52, 56.2, 47.1, 49.1, 49.5
See application file for complete search history.

(56) References Cited

U.S. PATENT DOCUMENTS

| | | |
|---|---|---|
| 5,899,376 A | 5/1999 | Tatumi et al. |
| 2012/0006364 A1 * | 1/2012 | Kim ................ B08B 3/02 134/99.1 |
| 2013/0143361 A1 | 6/2013 | Lin et al. |

FOREIGN PATENT DOCUMENTS

| | | | |
|---|---|---|---|
| DE | 2514284 A1 * | 10/1976 | ........... B23K 3/0699 |
| JP | 7-131141 | 5/1995 | |

(Continued)

*Primary Examiner* — Kiley S Stoner
(74) *Attorney, Agent, or Firm* — Oblon, McClelland, Maier & Neustadt, L.L.P.

(57) ABSTRACT

A semiconductor fabrication apparatus has a transfer plate having a plurality of transfer pins to transfer a flux onto a plurality of lands on a semiconductor substrate, a holder movable with the transfer plate, to hold the transfer plate, a positioning mechanism to perform positioning of the holder so that the plurality of lands and the respective transfer pins contact each other; and a pitch adjuster to adjust a pitch of at least part of the plurality of transfer pins.

6 Claims, 7 Drawing Sheets

(56) References Cited

FOREIGN PATENT DOCUMENTS

| | | |
|---|---|---|
| JP | 8-266980 | 10/1996 |
| JP | 9-82719 | 3/1997 |
| JP | 2005-217055 | 8/2005 |
| JP | 2010-20973 | 1/2010 |
| KR | 627300 B1 * | 9/2006 |
| TW | 201028062 A1 | 7/2010 |

* cited by examiner

LINEAR EXPANSION COEFFICIENT OF VARIOUS MATERIALS

| MATERIAL | LINEAR EXPANSION COEFFICIENT | 50°C ELONGATION | 75°C ELONGATION |
|---|---|---|---|
| CERAMIC | 10 | 15 μm | 30 μm |
| BRASS | 19 | 29 μm | 57 μm |
| DURALUMIN | 27.3 | 41 μm | 82 μm |
| LEAD | 29.3 | 44 μm | 88 μm |
| CADMIUM | 29.8 | 45 μm | 90 μm |
| INDIUM | 33 | 50 μm | 100 μm |
| ZINC | 39.7 | 60 μm | 119 μm |
| SODIUM | 71 | 107 μm | 213 μm |

SEMICONDUCTOR FABRICATION APPARATUS AND SEMICONDUCTOR FABRICATION METHOD

CROSS REFERENCE TO RELATED APPLICATIONS

This application is based upon and claims the benefit of priority from the prior Japanese Patent Application No. 2018-53261, filed on Mar. 20, 2018, the entire contents of which are incorporated herein by reference.

FIELD

Embodiments of the present disclosure relate to a semiconductor fabrication apparatus and a semiconductor fabrication method.

BACKGROUND

A plurality of lands on a semiconductor substrate are provided for soldering and are made of Cu for excellent conductivity. In order to prevent Cu oxidation, the land surfaces are previously covered with OSP (Organic Solderability Preservative) films. Solder cannot be applied on the lands when the land surfaces are covered with the OSP films. Therefore, a process is performed to transfer a flux onto the lands to remove the OSP films and then apply solder on the lands.

A transfer plate having a plurality of transfer pins may be used for transferring the flux, all at once, onto the plurality of lands on the semiconductor substrate. The number of the plurality of transfer pins and a pin pitch on the transfer plate are designed in advance, in accordance with the number of lands onto which the flux is to be transferred and a land pitch, on a semiconductor substrate.

However, a semiconductor-substrate production process generally includes a heating process such as thermal treatment, so that the pitch of a plurality of lands on the semiconductor substrate may vary nonuniformly due to the effect of heat. Especially, the amount of expansion and contraction of the semiconductor substrate to temperature varies depending on the thickness, material, etc. of the semiconductor substrate. The volume expansion rate of the semiconductor substrate varies depending production lots, so that the amount of expansion and contraction of the semiconductor substrate may also vary even at the same temperature.

When the amount of expansion and contraction of the semiconductor substrate varies, the land pitch also varies depending on the location. This may result in that the center position of a transfer pin displaces from the center position of the corresponding land, so that the transfer pin and the land come into contact with each other. If the transfer pin and the land have contact with each other, the flux is not transferred on the land entirely, so that the OSP film remains on part of the land, which may results in a small solder contact area on the land, causing a solder connection failure.

DETAILED DESCRIPTION

According to the present embodiment, there is provided a semiconductor fabrication apparatus has:

a transfer plate having a plurality of transfer pins to transfer a flux onto a plurality of lands on a semiconductor substrate;

a holder movable with the transfer plate, to hold the transfer plate;

a positioning mechanism to perform positioning of the holder so that each of the plurality of lands and the corresponding transfer pin come into contact with each other; and a pitch adjuster to adjust a pitch of at least part of the plurality of transfer pins.

Hereinbelow, an embodiment of the present disclosure will be explained with reference to the drawings. In the accompanying drawings of the present specification, for simplicity in drawings and easy understanding, the scale, the ratio of height to width, etc. are modified to be exaggerated from those of actual ones, according to need.

Moreover, the terms such as "parallel", "intersect", and "the same", and the values of, for example, length and angle, which define shape, geometrical condition, and the degree of shape and geometrical condition, used in the present specification, are not necessary be limited to their strict definitions, but are interpreted to include the range to the extent that a similar function can be expected.

Figure 1:
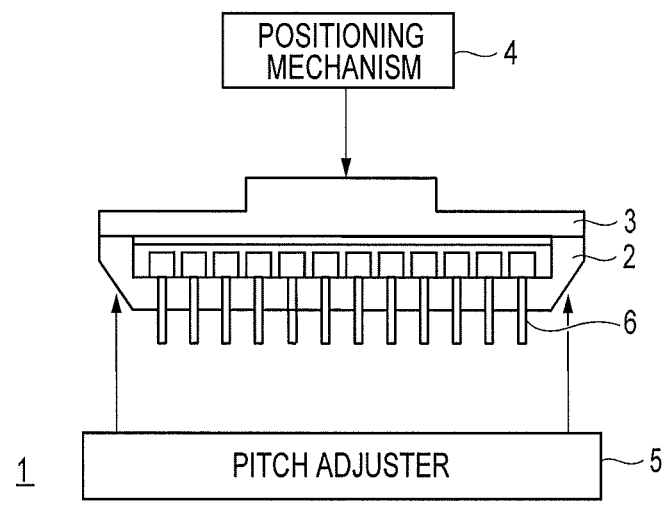
FIG. 1 is a schematic diagram showing a unique configuration of a semiconductor fabrication apparatus according to an embodiment.

FIG. 1 is a schematic diagram showing a unique configuration of a semiconductor fabrication apparatus 1 according to an embodiment. The semiconductor fabrication apparatus 1 of FIG. 1 has a function of transferring a flux onto a plurality of lands on a semiconductor substrate in a ball mounting process. The configuration for achieving this function is shown in FIG. 1. In FIG. 1, the configurations for fabrication of a layer structure, for patterning, etc. of a semiconductor device are omitted. The semiconductor fabrication apparatus 1 of FIG. 1 is applicable to fabrication of various types of semiconductor devices having a plurality of lands, with no limitation on the actual type, usage of the semiconductor devices.

The semiconductor fabrication apparatus 1 of FIG. 1 is provided with a transfer plate 2, a holder 3, a positioning mechanism 4, and a pitch adjuster 5.

Figure 2A:
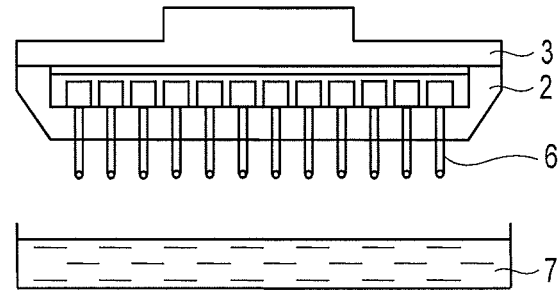
FIG. 2A is a diagram showing a step of transferring a flux onto lands.
Figure 2B:
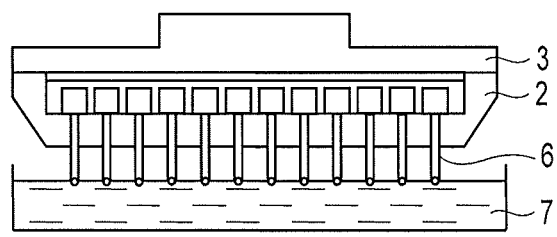
FIG. 2B is a diagram showing a step following to the step of FIG. 2A.
Figure 2C:
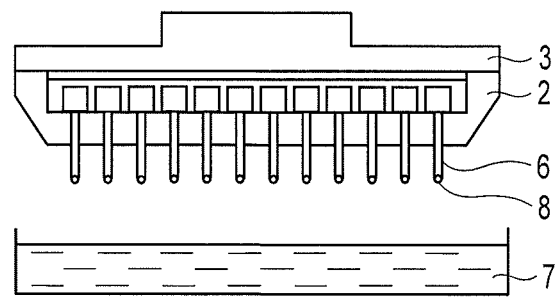
FIG. 2C is a diagram showing a step following to the step of FIG. 2B.
Figure 2D:
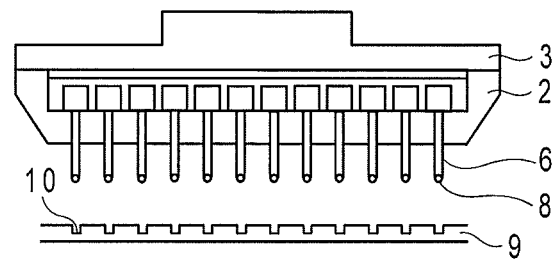
FIG. 2D is a diagram showing a step following to the step of FIG. 2C.
Figure 2E:
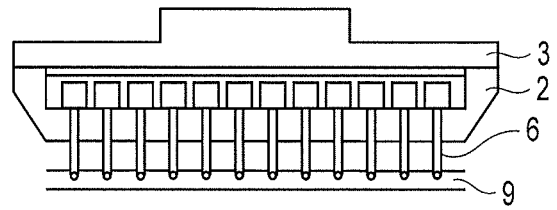
FIG. 2E is a diagram showing a step following to the step of FIG. 2D.
Figure 2F:
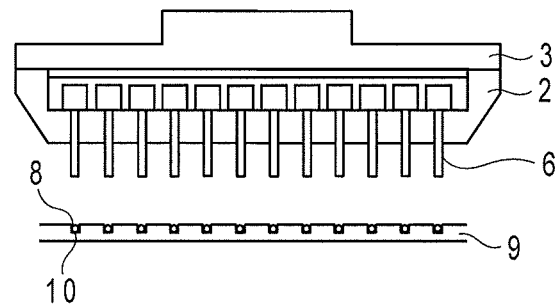
FIG. 2F is a diagram showing a step following to the step of FIG. 2E.

The transfer plate 2 has a plurality of transfer pins 6 for transferring a flux onto a plurality of lands on a semiconductor substrate. After being positioned above a flux bath 7 as shown in FIG. 2A, the transfer plate 2 contacts the transfer pins 6 with the flux bath 7 as shown in FIG. 2B. Accordingly, as shown in FIG. 2C, a flux 8 is applied to the tip of each transfer pin 6. Subsequently, as shown in FIG. 2D, the transfer plate 2 is positioned above a semiconductor substrate 9, and then as shown in FIG. 2F, contacts each transfer pin 6 with the corresponding one of lands 10 on the semiconductor substrate 9. Accordingly, the flux 8 is transferred onto each land 10.

The holder 3 is movable with the transfer plate 2, to hold the transfer plate 2. For example, the holder 3 is integrally joined with the transfer plate 2, in which the holder 3 is moved in a horizontal direction to perform positioning of the transfer pins 6 and the lands 10. Moreover, the holder 3 may be moved in a vertical direction to contact the transfer pins 6 with the lands 10.

The positioning mechanism 4 moves the holder 3 in the horizontal and vertical directions to perform positioning of the plurality of lands 10 and the plurality of transfer pins 6. The positioning mechanism 4 may move a stage not shown, on which the semiconductor substrate 9 is placed, in the horizontal direction. There is no limitation on the detailed configuration of the positioning mechanism 4. For example, the positioning mechanism 4 may perform positioning of the lands 10 and the transfer pins 6, with an alignment position on the semiconductor substrate 9 as a reference.

The pitch adjuster 5 adjusts the pitch of at least part of the plurality of transfer pins 6. The pitch adjuster 5 applies at least one of heat and tensile stress to the transfer plate 2 and/or the holder 3 to adjust the pitch of at least part of the plurality of transfer pins 6.

More specifically, the pitch adjuster 5 may have a heater to heat at least one of the transfer plate 2 and the holder 3. In this case, the heater may be disposed in the vicinity of the periphery of the transfer plate 2 and of the holder 3 so that the pitch of the transfer pins 6 at the periphery side of the transfer plate 2 becomes wider than the pitch of the transfer pins 6 at the center side of the transfer plate 2, among the plurality of transfer pins 6 on the transfer plate 2. The pitch adjuster 5 having the heater or the like moves together with the transfer plate 2 and the holder 3 under control by the positioning mechanism 4.

Figure 3A:
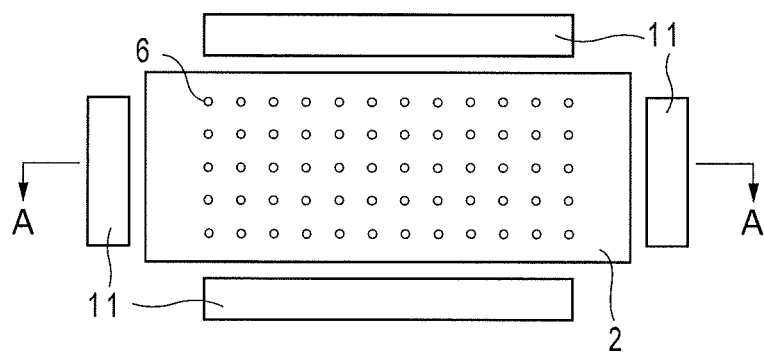
FIG. 3A is a plan view of an example of heaters 11 arranged at the periphery of a transfer plate 2.
Figure 3B:
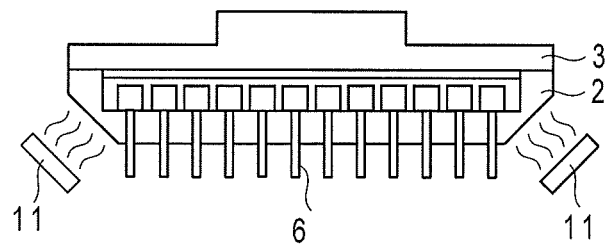
FIG. 3B is a sectional view taken on line A-A of FIG. 3A.

FIGS. 3A and 3B are diagrams showing one example of heaters 11 disposed in the vicinity of the periphery of the transfer plate 2. FIG. 3A is a plan view of the transfer plate 2 and its periphery. FIG. 3B is a sectional view taken on line A-A of FIG. 3A. FIG. 3A shows an example of the heaters 11 arranged so as to face four end faces of a rectangular transfer plate 2. Although FIG. 3A shows an example in which four heaters 11 are arranged so as to face four end faces of the transfer plate 2, a ring heater 11 may be disposed so as to surround the four end faces of the transfer plate 2. Moreover, two heaters 11 may be arranged only on both sides of the transfer plate 2 in a longitudinal direction.

As shown in FIGS. 3A and 3B, by arranging the heaters 11 along the periphery of the transfer plate 2, the transfer plate 2 expands at its periphery side due to heat to widen the pitch of the transfer pins 6 at the periphery side of the transfer plate 2, more than at the center side of the transfer plate 2, among the plurality of transfer pins 6 on the transfer plate 2.

Figure 4:
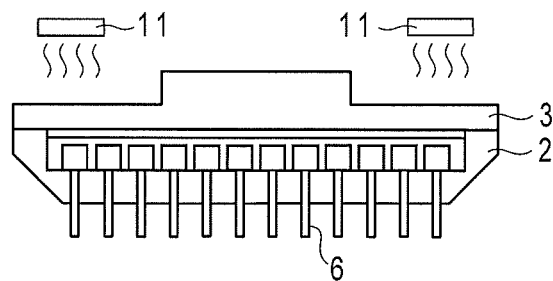
FIG. 4 is a diagram of an arrangement of heaters in the vicinity of the periphery of a holder.

Instead of being arranged in the vicinity of the periphery of the transfer plate 2, the heaters 11 may be arranged in the vicinity of the periphery of the holder 3, as shown in FIG. 4. In the case of FIG. 4, since the transfer plate 2 is integrally joined to the holder 3, when the holder 3 expands at its periphery due to heat, the transfer plate 2 also expands in the same manner, to widen the pitch of the transfer pins 6 at the periphery side of the transfer plate 2, more than at the center side of the transfer plate 2, among the plurality of transfer pins 6 on the transfer plate 2.

As described above, the pitch adjuster 5 adjusts the pitch of at least part of the transfer pins 6 on the transfer plate 2, for example, with heating by the heater 11. A linear expansion coefficient [ppm] is different depending on the material of the transfer plate 2. An amount of expansion and contraction ΔL of an object is expressed by the following expression (1), using a linear expansion coefficient a and a temperature increase ΔT.

$$\Delta L = \alpha L \Delta T \quad (1)$$

The temperature (reflow temperature) in a reflow process in applying the flux 8 or solder is about 260° C. It is considered that the semiconductor device is not exposed to a temperature higher than the reflow temperature. Solder resist, a core material, etc., which are the material of the semiconductor substrate 9, have a glass transition temperature of about 150° C. It is considered that the maximum temperature to which the semiconductor substrate 9 may be exposed is 150° C. or lower. Accordingly, in the present embodiment, the degree of expansion of the semiconductor substrate 9 is estimated to adjust the pitch of the transfer pins 6 on the transfer plate 2 in accordance with the estimated degree of expansion, under the assumption that the semiconductor substrate 9 may be heated at about 150° C. at maximum.

Figure 5A:
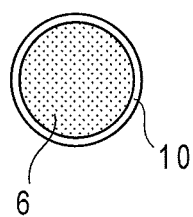
FIG. 5A is a figure showing an example in which positional displacement does not occur between a land and a transfer pin.
Figure 5B:
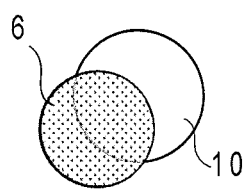
FIG. 5B is a figure showing an example in which positional displacement occurs between a land and a transfer pin.
Figure 5C:
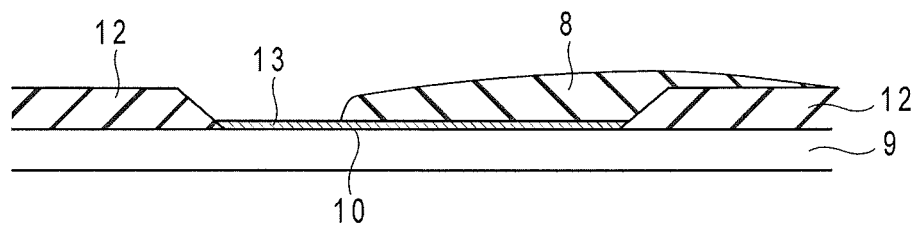
FIG. 5C is a figure showing an example of transfer of a flux by means of a transfer pin under the situation that positional displacement occurs as shown in FIG. 5B.
Figure 5D:
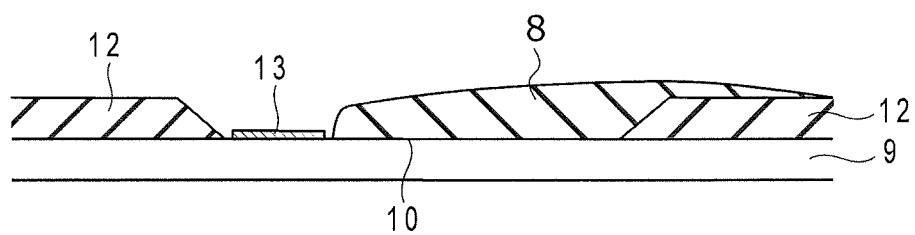
FIG. 5D is a figure showing a state where an OSP film remains on part of a land.
Figure 5E:
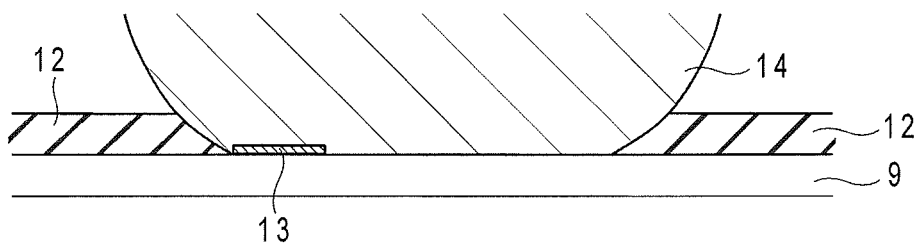
FIG. 5E is a figure showing a state where part of a solder ball does no have contact with a land due to the presence of an OSP film.

FIG. 5A shows an example in which positional displacement does not occur between a land 10 and the corresponding transfer pin 6. FIG. 5B shows an example in which positional displacement occurs between a land 10 and the corresponding transfer pin 6. The positional displacement in FIG. 5B may occur when, for example, the semiconductor substrate 9 expands in a heating step or the like in the fabrication process. A patterned resist film 12 is formed on the semiconductor substrate 9. An OSP film 13 is exposed at the location where part of the resist film 12 has been removed by patterning. FIG. 5C shows an example in which transfer of the flux 8 is performed with the transfer pins 6 under the situation that positional displacement occurs as shown in FIG. 5B. In this case, the flux 8 is transferred, not to the entire area of the land 10, but only to part of the land 10. When reflow and cleaning are performed in this condition, the OSP film 13 remains on part of the land 10, as shown in FIG. 5D. When a solder ball 14 is applied while the OSP film 13 remains, as shown in FIG. 5E, the solder ball 14 does not contact Cu of the land 10 in the place where the OSP film 13 remains, thereby causing solder contact failure.

Figure 6:
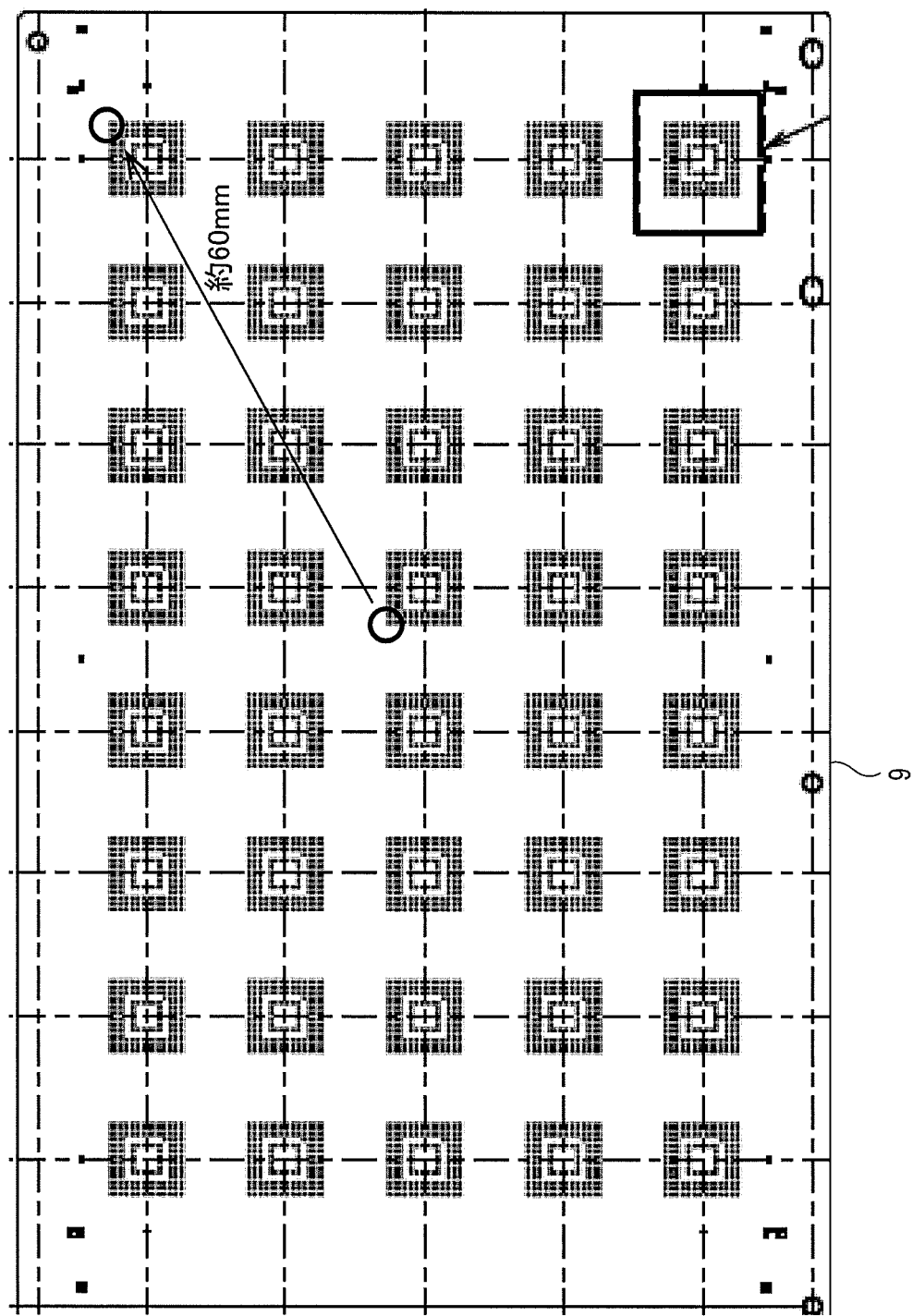
FIG. 6 is a diagram showing a method of estimating land positional displacement.

Concerning the positional displacement amount of the lands 10 on the semiconductor substrate 9, it is preferable to set the alignment position on the semiconductor substrate 9 as a reference. FIG. 6 is a diagram showing a method of estimating the positional displacement amount of the lands 10 based on the difference in distance from the alignment position as a reference position (for example, the center position) on the semiconductor substrate 9 to a land 10 located at a corner in a diagonal direction. In the example of FIG. 6, the distance from the alignment position to the land 10 located at the corner in the diagonal direction is 60 mm in designed value. For example, it is supposed that measured values of the distance from the alignment position to the land 10 located at the corner in the diagonal direction, in a plurality of semiconductor substrates 9 in a given lot, are in the range from 60.05 mm to 60.08 mm. In this case, the positional displacement amount is in the range from 50 μm to 80 μm.

Figures 7, 8:
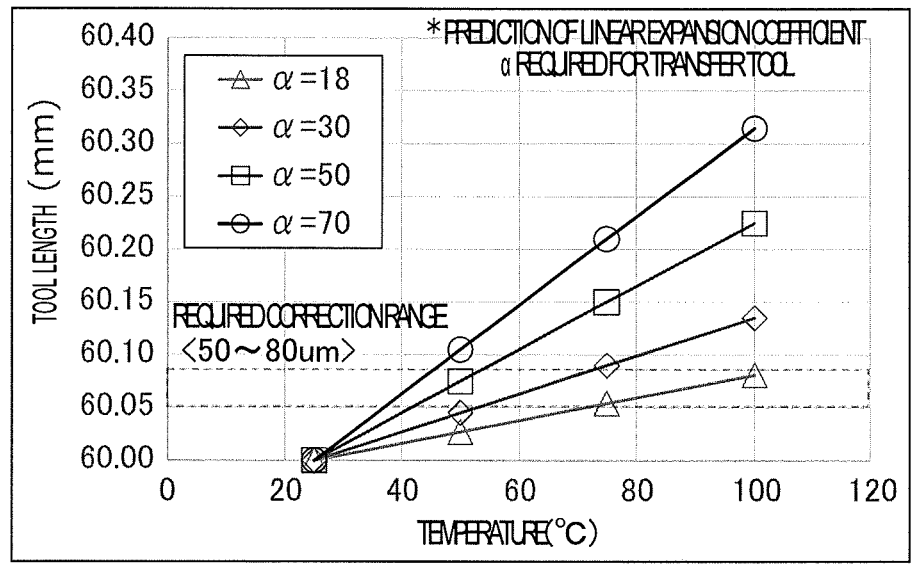
FIG. 7 is a graph showing a correspondence relationship between temperature and elongation amount for a plurality of materials different in linear expansion coefficient.
FIG. 8 is a figure showing a correspondence relationship between linear expansion coefficient and elongation amount at 50° C. and 75° C. for a plurality of materials.

FIG. 7 is a graph showing a correspondence relationship between temperature and elongation amount for a plurality of materials different in linear expansion coefficient. The graph in FIG. 7 shows elongation amounts at the temperature in the range from 0° C. to 120° C. for materials having linear expansion coefficients a of 18 ppm, 30 ppm, 50 ppm, and 70 ppm, respectively. According to FIG. 7, a material having a linear expansion coefficient a of about 30 ppm is preferable for correcting the elongation amount in the range from 50 μm to 80 μm.

FIG. 7 is just an example. The positional displacement amounts of the lands 10 vary depending on the material, temperature, etc. of the semiconductor substrate 9. It is therefore desirable to measure the positional displacement amounts of the lands 10 with the method of FIG. 6 to adjust the temperature and heating time of the heater 11 in accordance with the measured values of the positional displacement amounts. If the elongation amounts of the transfer pins 6 cannot be matched with the positional displacement amounts of the lands 10, only with the temperature and heating time of the heater 11, it is desirable to change the material of the transfer plate 2 or the holder 3 to be heated by the heater 11.

FIG. 8 is a figure showing a correspondence relationship between linear expansion coefficient and elongation amount at 50° C. and 75° C. for a plurality of materials. As shown in FIG. 8, the linear expansion coefficient is largely different depending on the materials, and the elongation amount is different at 50° C. and 75° C. depending on the linear expansion coefficient. Among the materials listed in FIG. 8, duralumin is the material that shows characteristics closest to the result of FIG. 7. However, FIG. 7 is based on an assumption that the elongation amount is in the range from 50 μm to 80 μm at the temperature in the range from 50° C. to 100° C., and hence duralumin is not always the best choice.

Figure 9:
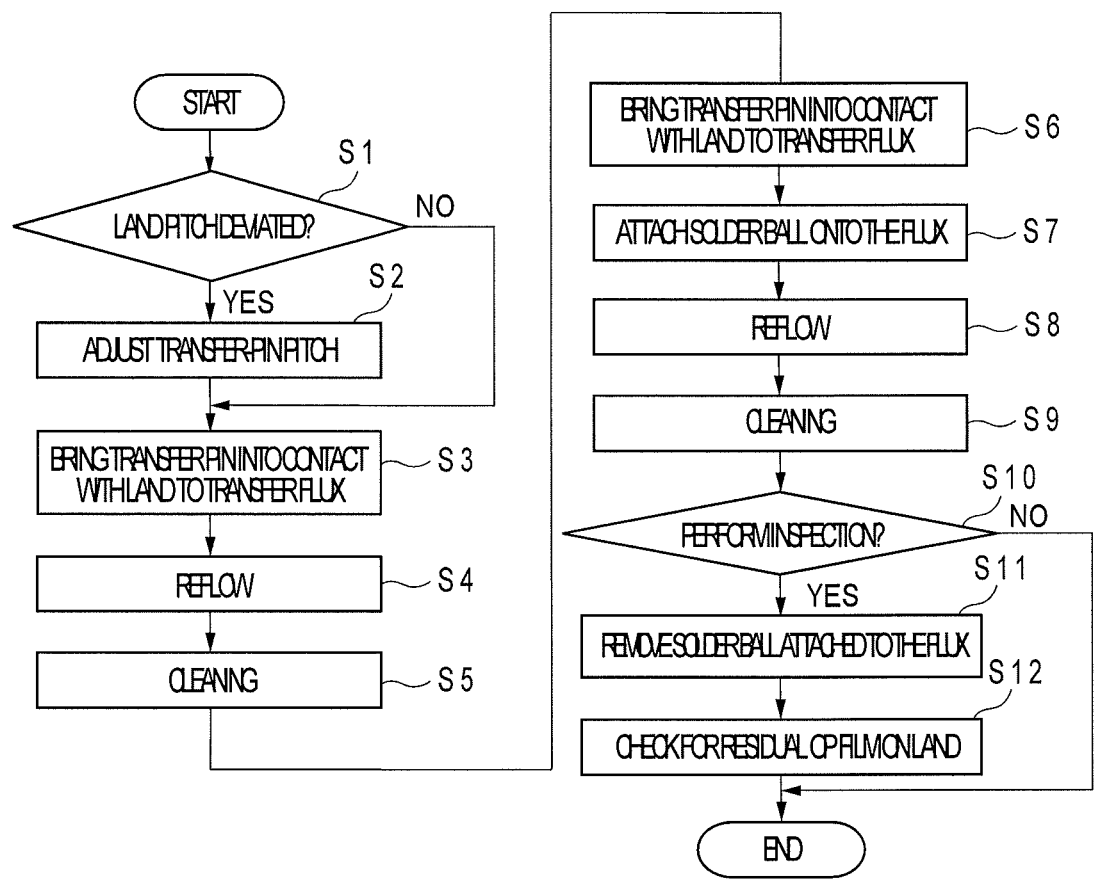
FIG. 9 is a flowchart showing a ball mounting process to be performed by the semiconductor fabrication apparatus 1 according to the present embodiment.

FIG. 9 is a flowchart showing a ball mounting process to be performed by the semiconductor fabrication apparatus 1 according to the present embodiment. The ball mounting process of FIG. 9 is largely separated into three processes, i.e. a removal process to the OSP film 13, a solder ball mounting process, and a soldering-failure inspection process. The soldering-failure inspection process is not an essential process because it is not always performed to every semiconductor device.

It is supposed that the fabrication of all semiconductor devices is already complete before starting the process of the flowchart in FIG. 9. First of all, it is determined whether the pitch of at least part of a plurality of lands 10 on a semiconductor device is deviated from a design value (step S1). This determination step may be performed to take an image of the semiconductor device on its mounting surface side by a camera and to analyze the taken image to determine whether the difference between a measured value of and a design value of the pitch of the lands 10 exceeds a predetermined threshold value. When one lot has a plurality of semiconductor devices, the determination step S1 may be performed to one of the semiconductor devices to apply a result of the determination step to the other semiconductor devices in the same lot.

If it is determined as being deviated in step S1, the pitch adjuster 5 adjusts the pitch of at least part of the transfer pins 6 of the transfer plate 2, for example, by heating the transfer plate 2 and/or the holder 3 (step S2). The pitch adjuster 5 adjusts the pitch of the transfer pins 6 so that the positional displacement between the plurality of lands 10 on the semiconductor device and the plurality of transfer pins 6 of the transfer plate 2 becomes smaller to the extent that there is no practical problem.

If step S2 is complete or if it is determined as not being deviated in step S1, the plurality of transfer pins 6 on the transfer plate 2 are contacted with the plurality of lands 10 on the semiconductor device to transfer the flux 8 onto the lands 10 (step S3).

Subsequently, a reflow step is performed at a predetermined temperature (step S4). By performing the reflow step, the OSP film 13 reacts with the flux 8 to be removed. Then, a cleaning step is performed (step S5). In this way, the flux 8 is removed from the lands 10. The above steps S3 to S5 are included in the removal process to the OSP film 13.

Subsequently, the plurality of transfer pins 6 of the transfer plate 2 are again contacted with the plurality of lands 10 of the semiconductor device to transfer the flux 8 onto the lands 10 (step S6). If pitch adjustments has been performed by the pitch adjuster 5 to the transfer pins 6 in step S1, it is not required in step S6 to perform pitch adjustments by the pitch adjuster 5.

Subsequently, a solder ball is attached onto the flux 8 (step S7). Then, a reflow step is performed at a predetermined temperature to contact the solder ball with each land 10 (step S8). And then, cleaning is performed to remove the flux 8 (step S9). The above steps S6 to S9 are included in the solder ball mounting process.

Succeedingly, it is determined whether to perform inspection of the semiconductor device (step S10). If performing inspection, solder balls joined to the plurality of lands 10 of the semiconductor device are heated to be removed (step S11). Subsequently, an image of the semiconductor device is taken at its mounting surface side to see if there is an OSP film 13 remained, by analysis of the image taken (step S12).

In the example explained above, the pitch adjuster 5 heats the transfer plate 2 and/or the holder 3, with the heater 11, to adjust the pitch of at least part of the transfer pins 6. However, the pitch adjuster 5 may adjust stress applied to the transfer plate 2 and/or the holder 3 to adjust the pitch of the transfer pins 6.

Figure 10:
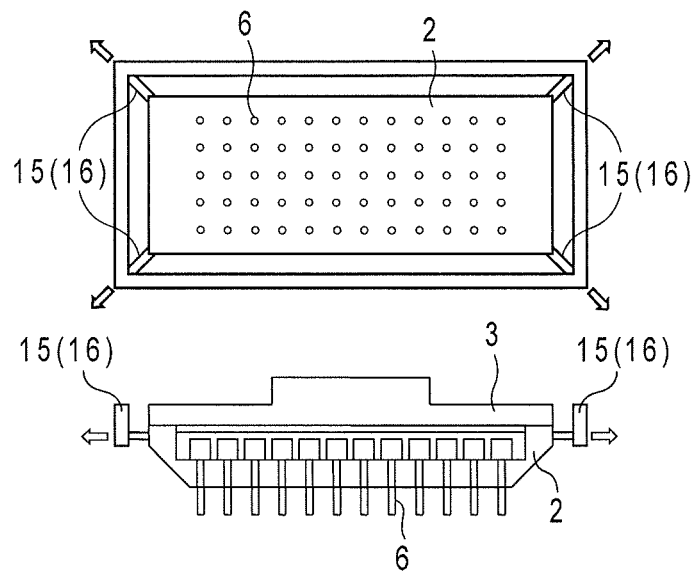
FIG. 10 is a diagram showing an example of a pitch adjuster having a stress adjusting unit.

FIG. 10 is a diagram showing an example of the pitch adjuster 5 having a stress adjuster 15. The stress adjuster 15 of FIG. 10 has four stress appliers 16 attached to four corners of the transfer plate 2. The stress appliers 16 apply stress to the transfer plate 2 to pull the transfer plate 2 in diagonal directions. When the same stress is applied to the four corners, the transfer plate 2 expands uniformly. It is therefore desirable to drive the stress appliers 16 with the same driving force of a motor not shown. In the same manner as in the case of using the heaters 11, the stress appliers 16 measure the distances from the alignment position of the semiconductor device to the corners of the lands 10 at the four corners to detect positional displacement with respect to a design value. Then, the stress appliers 16 apply tensile stress to the transfer plate 2 so that the pitch of the transfer pins 6 becomes larger by the degree of positional displacement. Stress required for stretching the transfer plate 2 by unit of length is different depending on the material, thickness, etc. of the transfer plate 2. It is therefore desirable to obtain in advance a correspondence relationship between the tensile stress and the elongation amount for the transfer plate 2 to be used.

Although FIG. 10 shows that the stress appliers 16 are attached to the four corners of the transfer plate 2, the places where the stress appliers 16 are attached are not limited to the four corners of the transfer plate 2. For example, the stress appliers 16 may each be attached to the center of the corresponding one of sides of a rectangular transfer plate 2.

As described above, according to the present embodiment, when the pitch of at least part of lands 10 becomes wider than a design value due to expansion of the semiconductor substrate 9 in the heating step of the semiconductor fabrication process, the transfer plate 2 and/or the holder 3 are heated or applied with stress to widen the pitch of transfer pins 6. Accordingly, the positional displacement between the lands 10 and the transfer pins 6 are restricted, so that the flux 8 can be transferred onto the entire area of the lands 10 to avoid such a problem that the OSP films remain in the lands 10.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor fabrication method comprising:
adjusting a pitch of at least part of a plurality of transfer pins of a transfer plate, the plurality of transfer pins transferring a flux onto a plurality of lands on a semiconductor substrate; and
contacting the plurality of transfer pins after the pitch is adjusted, with the corresponding one of the lands to transfer fluxes attached to tips of the plurality of transfer pins onto the respective plurality of lands,
wherein adjusting the pitch heats at least one of the transfer plate and a holder movable with the transfer plate.

2. The semiconductor fabrication method of claim 1, wherein a heater is disposed at an end side of the transfer plate and of the holder so that, among the plurality of transfer pins, a pitch between transfer pins at a periphery side of the transfer plate becomes wider than a pitch between transfer pins at a center side of the transfer plate.

3. The semiconductor fabrication method of claim 1, wherein a heater is disposed to surround a periphery of the transfer plate, and
the holder holds the transfer plate and the heater movable with each other.

4. The semiconductor fabrication method of claim 1, wherein the adjusting the pitch adjusts the pitch of the at least part of the transfer pins when a pitch between at least one of the plurality of lands and a reference position on the semiconductor substrate exceeds a predetermined threshold value.

5. The semiconductor fabrication method of claim 1, wherein the adjusting the pitch applies tensile stress to at least one of the transfer plate and the holder to adjust the pitch of the at least part of the transfer pins.

6. The semiconductor fabrication method of claim 5, wherein at least one of the transfer plate and the holder is a rectangular body, and
the adjusting the pitch applies the tensile stress to the rectangular body from four corner thereof in a diagonal direction.

* * * * *